United States Patent
Lim et al.

(10) Patent No.: US 7,088,010 B2
(45) Date of Patent: Aug. 8, 2006

(54) CHIP PACKAGING COMPOSITIONS, PACKAGES AND SYSTEMS MADE THEREWITH, AND METHODS OF MAKING SAME

(75) Inventors: Sheau Hooi Lim, Penang (MY); Choong Kooi Chee, Penang (MY)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 10/740,283

(22) Filed: Dec. 18, 2003

(65) Prior Publication Data

US 2005/0133938 A1    Jun. 23, 2005

(51) Int. Cl.
  *H01L 23/14*  (2006.01)
  *H01L 23/29*  (2006.01)

(52) U.S. Cl. ........................ 257/792; 257/789; 257/788; 257/709; 257/702

(58) Field of Classification Search ................ 257/668, 257/678, 687, 701, 702, 707, 709, 710, 787, 257/788, 789, 792
  See application file for complete search history.

(56) References Cited

U.S. PATENT DOCUMENTS

| | | | |
|---|---|---|---|
| 3,944,626 A | | 3/1976 | Honna et al. |
| 6,506,534 B1 * | 1/2003 | Nozaki et al. | 430/270.1 |
| 6,555,289 B1 | 4/2003 | Sasaki et al. | |
| 6,724,091 B1 * | 4/2004 | Jayaraman et al. | 257/778 |
| 6,790,589 B1 * | 9/2004 | Takechi et al. | 430/270.1 |
| 6,824,957 B1 * | 11/2004 | Okino et al. | 430/270.1 |
| 6,887,644 B1 * | 5/2005 | Nozaki et al. | 430/270.1 |
| 2002/0034873 A1 * | 3/2002 | Aoi | 438/627 |
| 2003/0100175 A1 * | 5/2003 | Nobutoki et al. | 438/623 |
| 2004/0082937 A1 * | 4/2004 | Ausiello et al. | 604/891.1 |
| 2004/0150327 A1 * | 8/2004 | Kawai et al. | 313/504 |
| 2004/0180188 A1 * | 9/2004 | Nakata et al. | 428/312.6 |
| 2004/0202961 A1 * | 10/2004 | Takechi et al. | 430/270.1 |
| 2005/0032357 A1 * | 2/2005 | Rantala et al. | 438/637 |
| 2005/0037284 A1 * | 2/2005 | Okino et al. | 430/270.1 |

* cited by examiner

*Primary Examiner*—Minhloan Tran
*Assistant Examiner*—Victor A. Mandala, Jr.
(74) *Attorney, Agent, or Firm*—Schwegman, Lundberg, Woessner & Kluth, P.A.

(57) ABSTRACT

A system for chip packaging includes an adamantoid packaging composition. The adamantoid composition ameliorates the CTE mismatch that typically exists between a packaged die and a resin-impregnated fiberglass mounting substrate. In an embodiment, the system includes a packaging composition that alone exhibits a CTE that is characteristic of an inorganic-filled underfill composite previously known. An embodiment is also directed to the assembly of a chip package that uses an adamantoid packaging composition.

29 Claims, 4 Drawing Sheets

CHIP PACKAGING COMPOSITIONS, PACKAGES AND SYSTEMS MADE THEREWITH, AND METHODS OF MAKING SAME

TECHNICAL FIELD

Embodiments relate to a packaged semiconductive die with integrated circuitry. More particularly, an embodiment relates to a packaging composition that is in contact with the die and the mounting substrate.

BACKGROUND INFORMATION

The thermal stability of packaging compositions such as underfill materials or encapsulation molding compounds, is important in reducing the warpage of chip packages. Desirable materials have properties such as high thermal stability, low shrinkage, a favorable coefficient of thermal expansion (CTE), and other qualities such as a low moisture uptake.

In chip packaging technology, the active surface of the die is subject to numerous electrical couplings that are usually brought to the edge of the chip package. Heat generation is significant at the active surface of the die, and consequently at the pin-out locations of the chip package. Electrical connections, referred to variously as bond wires, balls, bumps, and others, are connected to terminals on the active surface of a chip. The connections include solders and/or plastics that make mechanical connections and electrical couplings to a substrate. If the connections are solder bumps, the solder bumps on the flip-chip are soldered to the bonding pads on the substrate. In flip-chip packages, a gap exists between the flip-chip active surface and the mounting substrate. One characteristic of flip-chip technology is shear stress on the solder joints during temperature cycling of the device. This shear stress is partially a result of a difference in the CTE of the flip-chip and the mounting substrate.

Die materials such as silicon, germanium, and gallium arsenide, along with their packaging materials, may have CTEs in a range from about 3 ppm/° C. to about 6 ppm/° C. Mounting substrates are usually composites of organic-impregnated fiberglass dielectrics and metallic circuitry. These substrates may have CTEs in a range from about 15 ppm/° C. to about 25 ppm/° C. Consequently, a mismatch in the CTEs exists between the flip-chip and the mounting substrate. To reduce solder joint failures due to stress during thermal cycling, the solder joints are reinforced by filling the space between the flip-chip and the mounting substrate, and around the solder joints, with an underfill composite.

The packaging composition can include particulate filler inorganics such as silica or the like, and metal flakes or the like. The particulate filler increases the bulk modulus and acts as a CTE intermediary for the mismatched CTEs of the chip and the mounting substrate.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting in scope, the embodiments will be described and explained with additional specificity and detail through the use of the accompanying drawings in which.

DETAILED DESCRIPTION

An embodiment relates to a packaging composition that is applied to a die and other packaging structures. In an embodiment, the packaging composition includes an adamantoid material.

Adamantoids include a cage-like molecular unit that is highly symmetrical. Adamantane is a substantially pure adamantoid that can form a substantially "diamond" lattice. The lattice type of structure limits conformational change of the molecule and reduces the free volume of polymerized material. Hence, the shrinkage of material formulated with adamantane is low with reduced CTE. Adamantoids can have various properties. For example, adamantoids can have a tensile strength from about 12.0 KSI to about 12.4 KSI. Adamantoids can also have a coefficient of thermal expansion from about 5 ppm/° C. to about 60 ppm/° C. Adamantoids can also have a glass transition temperature from about 100° C. to above about 150° C.

The characteristic packing density of adamantoids and their hydrophobicity also decrease the moisture absorption when applied as part of a chip package. One embodiment relates to an adamantoid packaging composition that exhibits a CTE, among other properties, that is characteristic of inorganic-filled packaging compositions previously known.

In an embodiment the packaging composition is an adamantoid compound. In an embodiment, the adamantoid may be a functional group of a linear polymer. In an embodiment, the adamantoid may be a "pure" adamantane compound such as a linear adamantane polymer. In an embodiment, the adamantoid may be a "star" adamantane compound such as an adamantane sheet. In an embodiment, the adamantoid may be a three-diminsional (3-D) adamantane compound such as a three-dimensional adamantane lattice. In an embodiment, the adamantoid may be part of a graft copolymer. In an embodiment, the adamantoid may be part of a block copolymer.

The following description includes terms, such as "upper", "lower", "first", "second", etc. that are used for descriptive purposes only and are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. The term "chip" as used herein refers to a die that has been encapsulated in an organic, an inorganic, or a combination organic and inorganic housing. A "board" is typically a resin-impregnated fiberglass structure that acts as a mounting substrate for the chip.

Figure 1:
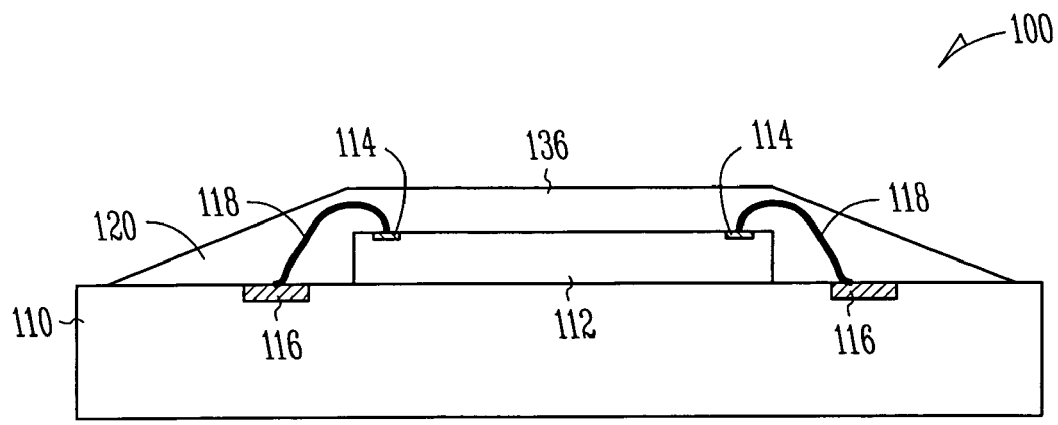
FIG. 1 is a cross-section of a package that includes a packaging composition as an encapsulation material for a die according to an embodiment.

FIG. 1 is a cross-section of a package that includes an adamantoid packaging composition as an encapsulation material for a die according to an embodiment. The package 100 includes a mounting substrate 110 that is a platform for an integrated circuit (IC) die 112. The die 112 includes a bond pad 114 that is in electrical communication with a wire bond pad 116 on the mounting substrate 110. Electrical communication is accomplished with a bond wire 118. The packaging composition 120 acts as an encapsulant for the die 112 according to any of the embodiments depicted in this disclosure and their art-recognized equivalents.

Figure 2:
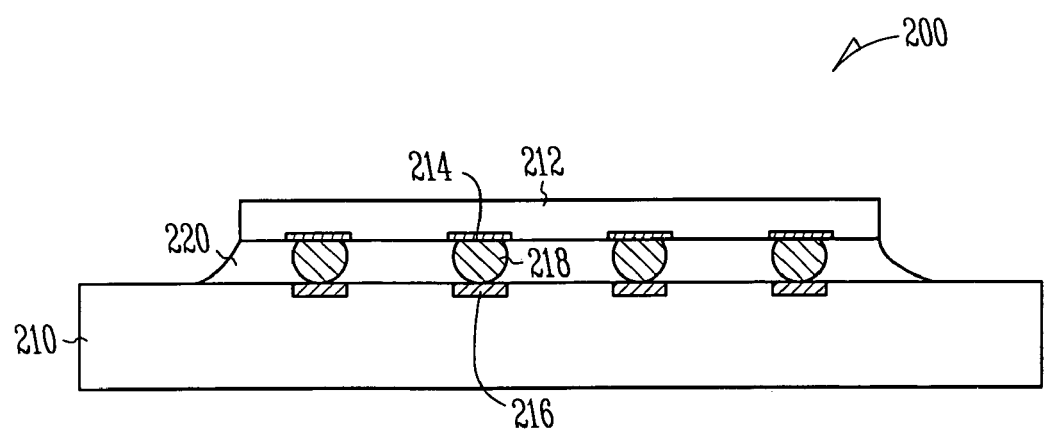
FIG. 2 is a cross-section of a package that includes a packaging composition as an underfill material according to an embodiment.

FIG. 2 is a cross-section of a package that includes an adamantoid packaging composition as an underfill material according to an embodiment. The package 200 includes a mounting substrate 210 that is a platform for an IC die 212. The die 212 is in a flip-chip mounting configuration with respect to the mounting substrate 210. The die 212 includes a bond pad 214 that is in electrical communication with ball grid array bond pad 216 on the mounting substrate 210. Electrical communication is accomplished with an electrical bump 218 such as a solder ball. The packaging composition 220 acts as an underfill material for the die 212 according to any of the embodiments depicted in this disclosure and their art-recognized equivalents.

Figure 3:
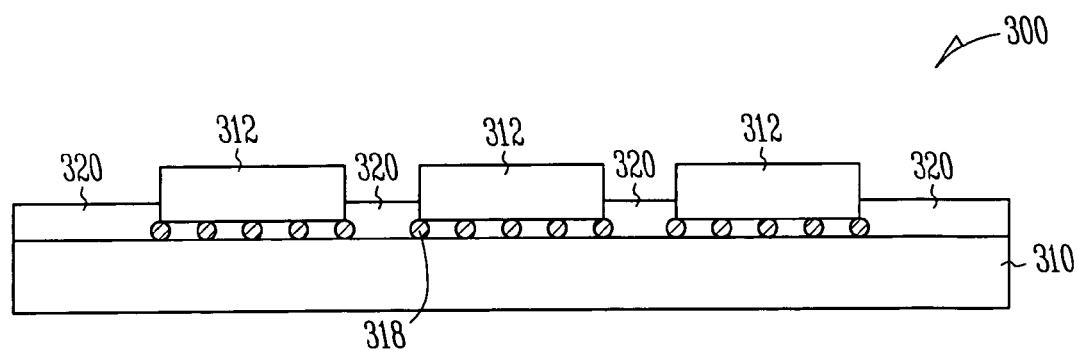
FIG. 3 is a cross-section of a package that includes a packaging composition as a mold cap material according to an embodiment.

FIG. 3 is a cross-section of a package that includes an adamantoid packaging composition as a mold cap material according to an embodiment. The package 300 includes a mounting substrate 310 that is a platform for an IC die 312. The die 312 is in a flip-chip mounting configuration with respect to the mounting substrate 310. Similar to the flip-chip configuration depicted in FIG. 2, the die 312 includes a bond pad (not pictured) that is in electrical communication with ball grid array bond pad (not pictured) on the mounting substrate 310. Electrical communication is accomplished with an electrical bump 318 such as a solder ball. The packaging composition 320 acts as an underfill material and as a mold compound cap material for the die 312 according to any of the embodiments depicted in this disclosure and their art-recognized equivalents. The packaging composition 320 is configured to expose some of the die 312 to facilitate heat exchange.

Figure 4:
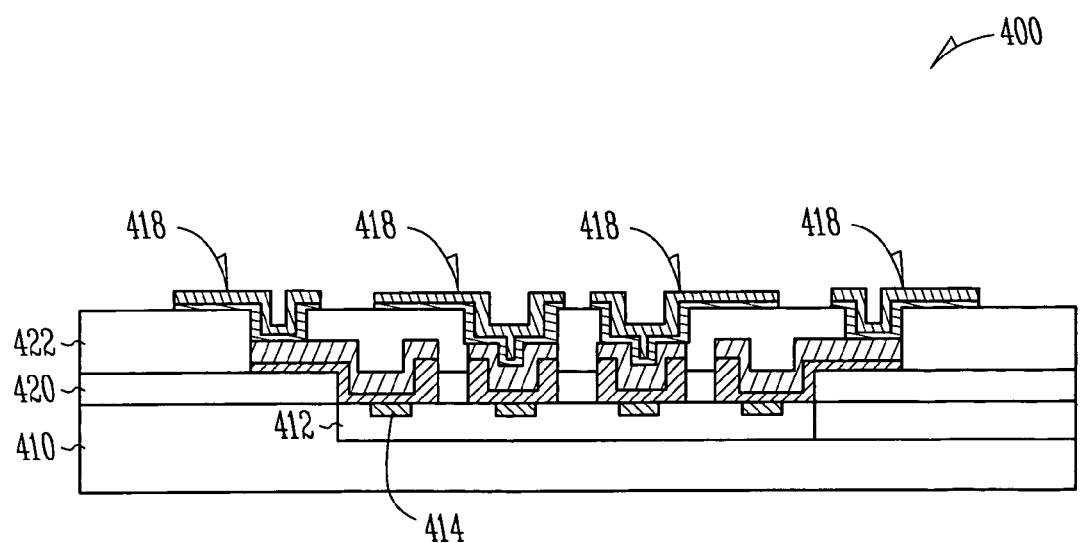
FIG. 4 is a cross-section of a package that includes a packaging composition as a bumpless buildup layer according to an embodiment.

FIG. 4 is a cross-section of a package that includes an adamantoid packaging composition as a bumpless buildup layer according to an embodiment. The package 400 includes a mounting substrate 410 that is a platform for an IC die 412. The die 412 is in a bumpless build-up layer (BBUL) mounting configuration with respect to the mounting substrate 410. The die 412 includes a bond pad 414 that is "pinned out" through a series of electrical build-up couplings 418 above and on both the mounting substrate 410 and the die 412. The packaging compositions 420 and 422 act as dielectric build-up materials for the mounting substrate 410 and the die 412 according to any of the embodiments depicted in this disclosure and their art-recognized equivalents. In an embodiment, either the packaging composition 420 or the packaging composition 422, or both, include an adamantoid.

Figure 5:
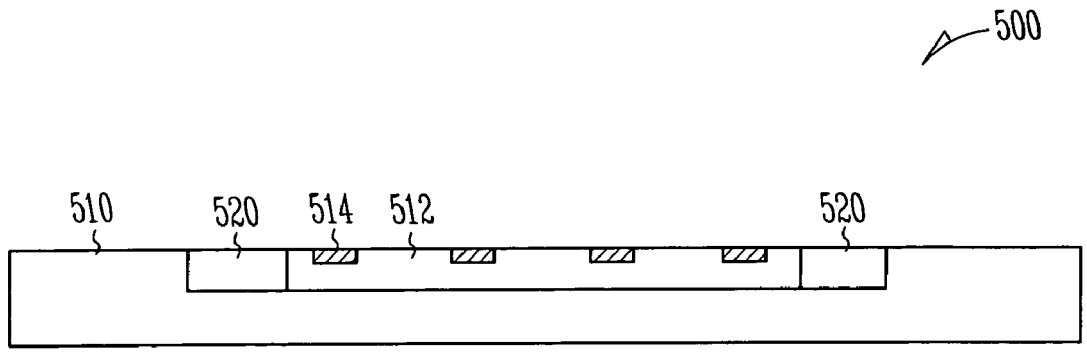
FIG. 5 is a cross-section of a package that includes a packaging composition as a die-core fill material according to an embodiment.

FIG. 5 is a cross-section of a package that includes an adamantoid packaging composition as a die-core fill material according to an embodiment. The package 500 includes a mounting substrate 510 that is a platform for an IC die 512. The mounting substrate 510 is a dielectric core. In an embodiment, the mounting substrate 510 is a heat sink core such as a metallic core. The die 512 is in a BBUL mounting configuration with respect to the mounting substrate 510. The die 512 includes a bond pad 514. The packaging composition 520 acts as a gap-spanning dielectric build-up material for both the mounting substrate 510 and the die 512 according to any of the embodiments depicted in this disclosure and their art-recognized equivalents.

Figure 6:
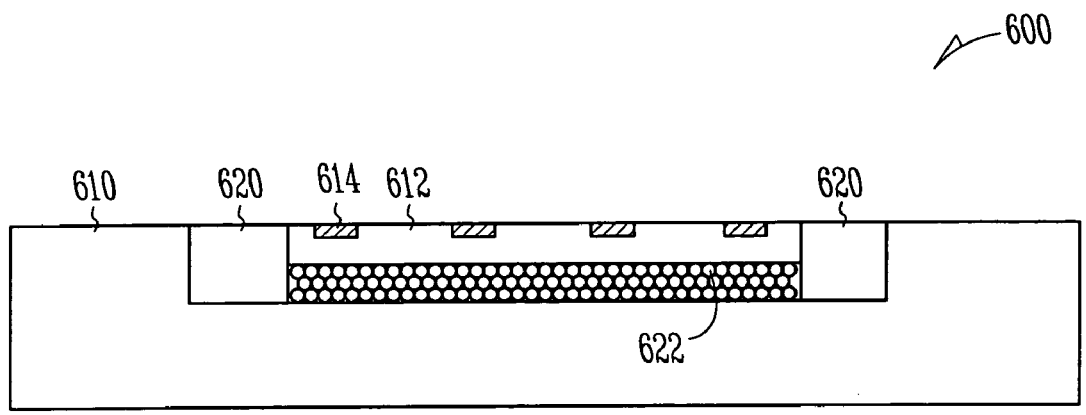
FIG. 6 is a cross-section of a package that includes a packaging composition as a die-core fill material according to an embodiment.

FIG. 6 is a cross-section of a package that includes an adamantoid packaging composition as a die-core fill material according to an embodiment. The package 600 includes a mounting substrate 610 that is a platform for an IC die 612. In an embodiment, the mounting substrate 610 is a dielectric core. In an embodiment, the mounting substrate 610 is a heat sink core such as a metallic core. The die 612 is in a BBUL mounting configuration with respect to the mounting substrate 610. The die 612 includes a bond pad 614. The packaging composition 620 acts as a gap-spanning dielectric build-up material for both the mounting substrate 610 and the die 612 according to any of the embodiments depicted in this disclosure and their art-recognized equivalents. A reflow metal board material 622 is disposed between the backside surface of the chip 612 and the mounting substrate 610.

Figure 7:
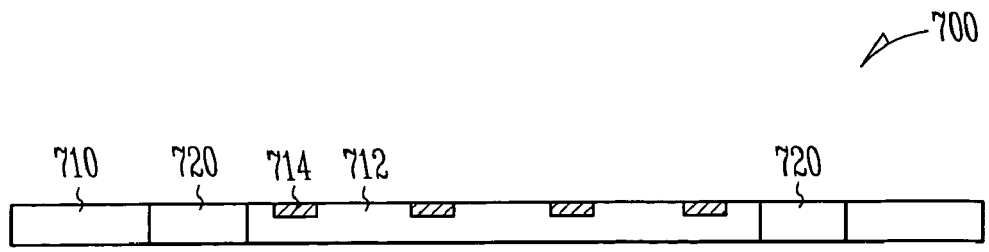
FIG. 7 is a cross-section of a package that includes a packaging composition as a die-core fill material for a thinned die package according to an embodiment.

FIG. 7 is a cross-section of a package that includes an adamantoid packaging composition as a die-core fill material for a thinned die package according to an embodiment. The package 700 includes a mounting substrate 710 that is a platform for an IC die 712. In an embodiment, the mounting substrate 710 is a dielectric core. In an embodiment, the mounting substrate 710 is a heat sink core such as a metallic core. The die 712 includes a bond pad 714. The packaging composition 720 acts as a gap-spanning dielectric build-up material for both the mounting substrate 710 and the die 712 according to any of the embodiments depicted in this disclosure and their art-recognized equivalents.

Functionalization of Adamantoids

In an embodiment the adamantoid packaging composition is a functionalized adamantane. The adamantane molecule has the structure

(I)

that includes ten sites for functionalization. Functionalization of alkyl-type structures such as adamantoids can be done by halogenation chemistry, in particular bromination chemistry. In an embodiment, the adamantane molecule is functionalized at any one or more of its four methine sites. In an embodiment, the adamantane molecule is functionalized at any one or more of its and six methylene sites. In an embodiment, the adamantane molecule is functionalized at any one or more of its four methine sites and at any one or more of its six methylene sites. In an embodiment, the adamantane molecule is functionalized according the conventional chemical methods of functionalizing alkane compounds.

In an embodiment, the adamantane molecule is functionalized according to the formula:

-Ad-(R$_a$)$_m$,  (II)

where Ad is an adamantoid, and R$_a$ is at least one independent functional group, where R, and R$_b$ (see below) independently represent one of a hydrogen atom, an alkyl group, or an aryl group, and for the functionalization of an adamantoid unit, m represents the degree of functionalization. For example, for adamantane, m represents an integer from 0 to 10.

In an embodiment, R$_a$ is a hydrogen atom. In an embodiment, R$_a$ is an alkyl group. In an embodiment, R$_a$ is an alkyl group containing as a substituent at least one functional group including —OH. In an embodiment, R$_a$ is an alkyl group containing as a substituent at least one functional group including —OCH$_3$. In an embodiment, R$_a$ is an alkyl group containing as a substituent at least one functional group including —OCOR, where R is independently one of a hydrogen atom, an alkyl group, or an aryl group. In an embodiment, R$_a$ is an alkyl group containing as a substituent at least one functional group including —NHCOR. In an embodiment, R$_a$ is an alkyl group containing as a substituent at least one functional group including —NHSO$_2$R. In an embodiment, R$_a$ is an alkyl group containing as a substituent at least one functional group including —N(R)COR$_b$ where R$_b$ independently represents one of a hydrogen atom, an alkyl group, or an aryl group. In an embodiment, R$_a$ is an alkyl group containing as a substituent at least one functional group including —N(R)SO$_2$R$_b$. In an embodiment, R$_a$ is an alkyl group containing as a substituent at least one functional group including —COOH. In an embodiment, R$_a$ is an alkyl group containing as a substituent at least one functional group including —COOR. In an embodiment, R$_a$ is an alkyl group containing as a substituent at least one functional group including —CONHR. In an embodiment, R$_a$ is an alkyl group containing as a substituent at least one functional group including —CONHSO$_2$R. In an embodiment, R$_a$ is an alkyl group containing as a substituent at least one functional group including —CON(R)SO$_2$ R$_b$. In an embodiment, R$_a$ is an alkyl group containing as a substituent at least one functional group including —CON(R)(R$_b$). In an embodiment, R$_a$ is an alkyl group containing as a substituent at least one functional group including —CN.

Other functionalized adamantoids are also used according to an embodiment. For example, an adamantane unit is functionalized with at least one epoxy group polymer. The cross-linking density of the polymer can be controlled by the functionalization of the adamantane molecule. Hence, the properties of the packaging composition are controlled in one embodiment by the degree and quality of functionalization of the adamantoid.

In an embodiment, any of the functionalized adamantoid packaging compositions set forth in this disclosure is combined with a packaging structure to achieve a packaging system embodiment. The packaging structure is any of the structures depicted in FIGS. 1–7 or in other chip packaging structures according to an embodiment.

Linear Polymers Functionalized with Adamantoids

In an embodiment, a linear polymer such as poly(ether ketone) is functionalized with an adamantoid. Formula III illustrates a linear poly(ether ketone) is that functionalized with adamantane.

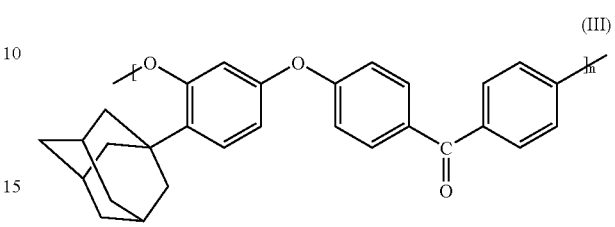

(III)

In an embodiment, the linear polymer is a silicone polymer that is functionalized with at least one adamantoid. In an embodiment, the linear polymer is an amino epoxy polymer that is functionalized with at least one adamantoid. In an embodiment, the linear polymer is an acrylate polymer that is functionalized with at least one adamantoid. In an embodiment, the linear polymer is an olefin resin polymer that is functionalized with at least one adamantoid. In an embodiment, the linear polymer is a low-viscosity vinyl polymer that is functionalized with at least one adamantoid. In an embodiment, the linear polymer is an elastomer polymer selected from silicone, acrylic, natural rubber, synthetic rubber, or the like that is functionalized with at least one adamantoid. In an embodiment, the linear polymer is a acrylic polymer that is functionalized with at least one adamantoid. Other linear polymers that are functionalized with at least one adamantoid are useable according to an embodiment.

Copolymerization of Adamantoids

In an embodiment, an adamantoid is used in a copolymerization process as the packaging composition. In an embodiment, the adamantoid is graft copolymerized. In an embodiment, the adamantoid is block copolymerized.

One graft copolymerized adamantoid includes poly(ether ketone) with an adamantoid group attached. Formula IV illustrates a graft copolymer with n repeating units and an adamantoid with p repeating units.

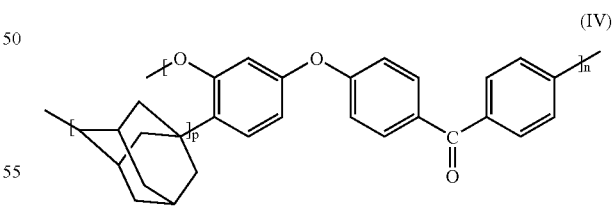

(IV)

In an embodiment, p is equal to one. In an embodiment, p is in a range from about 3 to about 10. In an embodiment, p is in a range from about 3 to about 5. In an embodiment, any of the linear polymers set forth in this disclosure, is substitutable for the linear polymer depicted in Formula IV.

In an embodiment, any of the graft coploymerized adamantoid packaging compositions set forth in this disclosure is combined with a packaging structure to achieve a packaging system embodiment. The packaging structure is any of the structures depicted in FIGS. 1–7 or in other packaging structures according to an embodiment.

In an embodiment, the adamantoid is block copolymerized. Formula V represents an embodiment of an epoxy block copolymerized adamantane compound that is used as an adamantoid packaging composition.

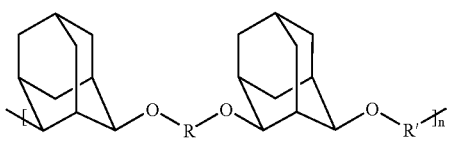

(V)

In this way, other block copolymerized adamantoids are used as the packaging composition. In an embodiment, an adamantoid is block copolymerized with an acetate that replaces the O—R—O position depicted in Formula VI. In an embodiment, an adamantoid is block copolymerized with an anhydride that replaces the O—R—O position depicted in Formula V. In an embodiment, an adamantoid is block copolymerized with an alcohol that replaces the O—R—O position depicted in Formula V. In an embodiment, an adamantoid is block copolymerized with an amide that replaces the O—R—O position depicted in Formula V. In an embodiment, an adamantoid is block copolymerized with an amine that replaces the O—R—O position depicted in Formula V.

In an embodiment, the adamantoid depicted in Formula V includes a plurality of repeated adamantoid units, such as:

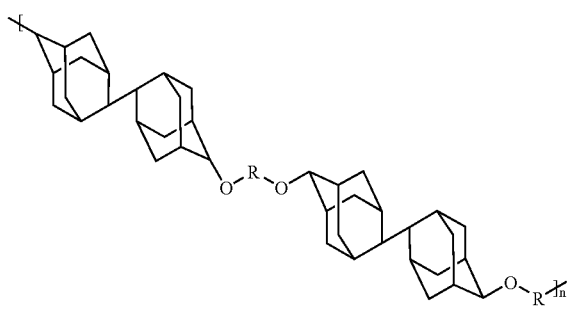

(VI)

Although the block copolymer of Formula VI illustrates two adamantoid groups per copolymer block, higher integral adamantoid groups are included in embodiments. In an embodiment, the number of integral adamantoid groups included in the block copolymer is between one and about 20. In an embodiment, the number of integral adamantoid groups included in the block copolymer is between about 2 and about 10. In an embodiment, the number of integral adamantoid groups included in the block copolymer is between about 3 and about 5.

In an embodiment, any of the block copolymerized adamantoid packaging compositions set forth in this disclosure is combined with a packaging structure to achieve a packaging system embodiment. The packaging structure is any of the structures depicted in FIGS. 1–7 or in other packaging structures according to an embodiment.

Star and 3-D Adamantoid Polymers

In an embodiment, a star adamantoid polymer is used as the packaging composition. Star adamantoid polymers are known in the art, and can be applied as packaging compositions according to an embodiment. In an embodiment, an adamantane trimer monoketone is converted to an intermediate adamantane trimer diketone, and subsequently converted to the adamantane pentamer star polymer by reaction with adamantane monoketone (adamantanone) in the presence of the conventional McMurry reagent.

In an embodiment, an adamantane pentamer star polymer is first converted to the adamantane pentamer star polymer diketone, and subsequently to the adamantane heptamer star polymer by reaction with adamantane monoketone in the presence of McMurry reagent. In an embodiment, other star adamantoid polymers are used as the packaging composition.

In an embodiment, a 3-D adamantoid polymer is used as the packaging composition. 3-D adamantoid polymers are known in the art, and can be applied as packaging compositions. In an embodiment, an adamantane cyclic tetramer is converted through the cycle tetraketone to a mixture of polymers including a 3-D octamer structure. In an embodiment, other 3-D adamantoid polymers are used as the packaging composition.

Additive Materials

Additive materials may be included with the adamantoid packaging compositions according to various embodiments. The additive materials and the packaging compositions make up "packaging compositions" according to embodiments set forth herein.

One additive material according to an embodiment is an elastomer for imparting flexibility to the packaging composition. Another additive material according to an embodiment is a hardener/crosslinker. The specific hardener/crosslinker that is employed will depend upon compatibility with the packaging composition. Hardeners/crosslinkers can be both aromatic and aliphatic in nature. The hardener/crosslinker in one embodiment is an anhydride composition. In another embodiment, the hardener/crosslinker is an amine.

Another additive material according to an embodiment is a catalyst. The specific catalyst that is employed will depend upon compatibility with the packaging composition. Some catalysts for the packaging compositions according to embodiments include imidizole and its derivatives, amines, and triphenylphosphine. Suitable anhydride hardeners include nadic anhydride, methyl cyclohexy anhydride, pthalic anhydride, or the like. Other suitable examples include, methylene diamine, di-aminodiphenyl sulfone, or the like.

Another additive material according to an embodiment is a reactive diluent. The specific reactive diluent that is employed will depend upon compatibility with the packaging composition. Because of the bonding and sealing nature of the method embodiments, the reactive diluent reacts and/or dissolves into the final packaging composition instead of volatilizing. Reactive diluents for the packaging compositions according to embodiments include other low-viscosity epoxy monomers such as Bi-phenyl epoxy, Bis-Phenol A epoxy, Bis-Phenol F epoxy, or the like. Other epoxies include phenyl glycidyl ethers, nonyl phenyl glycidyl ethers, p-butylphenyl glycidyl ethers, alkyl C8–C14 glycidyl ethers, cyclo aliphatic epoxies and the like.

Another additive material according to an embodiment is an adhesion promoter. The specific adhesion promoter that is employed will depend upon compatibility with the packaging composition. Adhesion promoters that can be added to the above packaging compositions include organic and inorganic combinations. In one embodiment, a silane coupling agent is used as an adhesion promoter. In another embodiment, an organo-zirconate composition is used as an adhesion promoter. In one embodiment, an organo-titanate composition is used as an adhesion promoter.

Another additive material according to an embodiment is a flow modifier such as a surfactant. The specific flow modifier that is employed will depend upon compatibility with the packaging composition. The surfactant requires properties such as compatibility with the packaging composition. In one embodiment the surfactant is anionic, such as long chain alkyl carboxylic acids, such as lauric acids, steric acids, and the like. In another embodiment, the surfactant is nonionic. Examples of nonionic surfactants are polyethtlene oxides, poly propylene oxides, and the like. In yet another embodiment the surfactant is cationic, such as alkyl ammonium salts such as terta butyl ammonium chlorides, or hydroxides.

Another additive material according to an embodiment is a deforming agent. The specific deforming agent that is employed will depend upon compatibility with the packaging composition. The deforming agent is also referred to as a plasticizer.

Another additive material according to an embodiment is a fluxing agent. Fluxing agents are mainly useful in no-flow underfill materials applications according to embodiments (e.g., see FIG. 2) including acids that can be dissolved in mixtures of the base resins and the cross-linking agents. One fluxing agent type includes organic carboxylic acids and the like. Another fluxing agent type includes polymeric fluxing agents and the like. The examples of fluxing agents are any chemicals containing hydroxyl (—OH) group or carboxylic (—COOH) group or both, such as glycerin, ethylene glycol, tartaric acid, adipic acid, citric acid, malic acid, meilic acid, and glutaric acid.

Another additive material according to an embodiment is a toughening agent. A toughening agent causes the packaging composition to resist crack propagation. In an embodiment, an elastomer is used as the toughening agent. The specific elastomer that is employed to toughen the adamantoid packaging composition will depend upon compatibility with the packaging composition. For example, an elastomer that is used with epoxy-functionalized compositions is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. Other elastomers may be used that are compatible with a given adamantoid packaging composition.

Another additive material according to an embodiment is an inorganic filler. Inorganic filler particles that optionally are added to the packaging compositions include oxides of various elements such as silica, alumina, and others. Other inorganic filler particles include nitrides such as silicon nitride and the like. Other inorganic filler particles include conductive materials such as graphite, diamond, and the like. When added, the packaging composition is more appropriately referred to as an "adamantoid packaging composite," in that it has inorganic filler particles as existing technology does, but includes an adamantoid packaging composition according to various embodiments. The adamantoid packaging composite embodiments, unlike most other embodiments, include a multi-phase substance. For purposes of this disclosure, an adamantoid packaging composition can include a composite as defined herein. Where an adamantoid packaging composition is referred to as a "single phase material", the reference is to the absence of a filler particulate, and not to the degree of solid solution homogeneity of the packaging composition with the various additive materials, etc.

Figure 8:
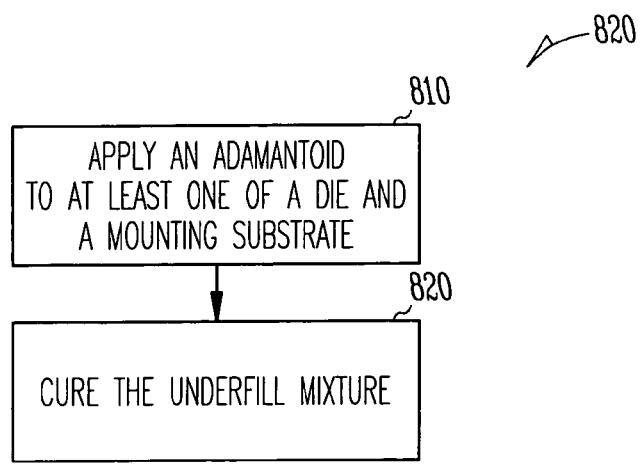
FIG. 8 is a process flow diagram that depicts a packaging process embodiment.

FIG. 8 is a method flow diagram 800 that depicts a packaging process embodiment.

At 810, the method 800 includes applying an adamantoid compound to at least one of a die and to a mounting substrate. In an example embodiment, the packaging composition 120 in FIG. 1 is applied to the die 112 and to the mounting substrate 110 as an encapsulation material. In an example embodiment, the packaging composition 220 in FIG. 2 is applied to the die 212 and to the mounting substrate 110 as an underfill material. In an example embodiment, the packaging composition 320 in FIG. 3 is applied to the die 312 and to the mounting substrate 310 as a mold cap compound. In an example embodiment, the packaging composition 420 and/or 422 in FIG. 4 is applied to the package mounting substrate 410. In an example embodiment, the packaging composition 520 in FIG. 5 is applied to the die 512 and to the mounting substrate 510 as a die/core connection. In an example embodiment, the packaging composition 620 in FIG. 6 is applied to the die 612 and to the mounting substrate 610 as a die/core connection. In an example embodiment, the packaging composition 720 in FIG. 7 is applied to the die 712 and to the mounting substrate 710 as a thinned die/core connection. In an embodiment, the method is completed at 810.

At 820, the packaging composition is cured. In an embodiment, curing is carried out by an autocatalytic processing path. In an embodiment, curing is carried out by an additive catalytic processing path. In an embodiment, curing is carried out by a diluent cross-linking/hardening processing path. In an embodiment, curing is carried out by a thermoset processing path. In an embodiment, curing is carried out by any combination thereof.

Figure 9:
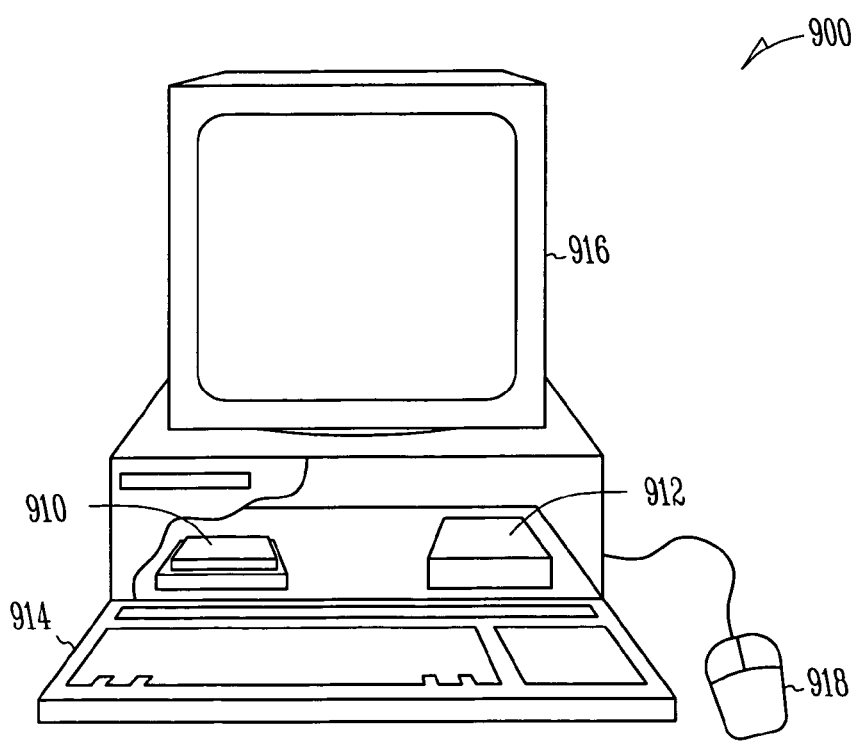
FIG. 9 is a perspective cut-away of a computing system that includes the packaging composition according to an embodiment.

FIG. 9 is a perspective cut-away of a computing system that includes an adamantoid packaging composition according to an embodiment. One or more of the foregoing embodiments of a chip package including an adamantoid packaging composition embodiment may be utilized in a computing system, such as the computing system 900 of FIG. 9. The computing system 900 includes at least one processor (not pictured), which is enclosed in a package 910, a data storage system 912, at least one input device such as keyboard 914, and at least one output device such as monitor 916, for example. The computing system 900 includes a processor that processes data signals, and may include, for example, a microprocessor, available from Intel Corporation. In addition to the keyboard 914, the computing system 900 can include another user input device, such as a mouse 918, for example.

For purposes of this disclosure, a computing system 900 embodying components in accordance with the claimed subject matter may include any system that utilizes embodiments of a chip package including an adamantoid packaging composition embodiment in the package 910, and/or in the data storage system 912. In either system, the adamantoid packaging composition may be part of a chip package, for example, for a data storage device such as dynamic random access memory, polymer memory, flash memory, and phase-change memory. The adamantoid packaging composition can also be part of a chip package that contains a processor, a digital signal processor (DSP), a micro-controller, an application specific integrated circuit (ASIC), or a microprocessor.

Adamantoid packaging composition embodiments set forth in this disclosure can be applied to devices and apparatus other than a traditional computer. For example, a die can be packaged with an embodiment of the adamantoid packaging composition and placed in a portable device such as a wireless communicator or a hand-held device such as a personal digital assistant and the like. Another example is a die that can be packaged with an adamantoid packaging composition and placed in a vehicle such as an automobile, a locomotive, a watercraft, an aircraft, or a spacecraft.

One embodiment relates to achieving an adamantoid packaging composition that includes physical properties of the previously known adamantoid packaging compositions that included inorganic particles. The previously known adamantoid packaging composition had coefficients of thermal expansion (CTEs) that were between the CTEs of the chip and the board. Accordingly, some embodiments include packaging compositions that have a range of compositions and combinations, so long as they have minimal overall physical properties of the previously known underfill composites.

Applied Packaging Compositions

The packaging compositions, as set forth above, include various embodiments and their equivalents. The following non-limiting discussion of various packaging compositions relates to adamantoids as set forth in this disclosure. Other compositions may be selected to impart similar final properties of packaging compositions. As such, adamantoids belong to a class of "bulky polymers" that have qualities such as high glass transition temperatures, low shrinkage, and low moisture uptake. One example of bulky polymers that are used in addition to or in replacement of adamantoids set forth in this disclosure include naphthalene and the like. Another example includes pyrene and the like. Another example includes at least two of adamantoids, napthalene and the like, and pyrene and the like.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A packaging system comprising:
a die; and
a bulky polymer packaging composition coupled to at least a portion of the die, wherein the bulky polymer is an adamantoid selected from adamantane compounds, adamantane polymers, functionalized adamantane compounds, block adamantane copolymers, graft adamantane copolymers, star adamantane polymers, three-dimensional adamantane polymers, and combinations thereof.

2. The packaging system of claim 1, further including a mounting substrate, wherein the packaging composition is in contact with at least a portion of the mounting substrate.

3. The packaging system of claim 1, wherein the bulky polymer is an adamantoid describable by $$-Ad-(R_a)m \quad (I)$$

wherein Ad represents the adamantoid,
wherein $R_a$ represents a hydrogen atom, an alkyl group, an alkyl group containing as a substituent at least one functional group selected from —OH, $OCH_3$, —OCOR, —NHCOR, -$NHSO_2R$, —N(R)$COR_b$, —N(R)$SO_2R_b$, —COOH, —COOR, —CONHR, —$CONHSO_2R$, —CON(R)$SO_2R_b$, —CON(R)($R_b$) and —CN, wherein R and $R_b$ independently represent a hydrogen atom, an alkyl group, or an aryl group, and m represents an integer of 0 to 10.

4. The packaging system according to claim 1, wherein the packaging composition further includes:
at least one additive material selected from an elastomer, a hardener/crosslinker, a catalyst, a reactive diluent, an adhesion promoter, a surfactant, a deforming agent, a fluxing agent, and a toughening agent.

5. The packaging system according to claim 1, wherein the packaging composition further includes:
at least one additive material selected from an elastomer, a hardener/crosslinker, a catalyst, a reactive diluent, an adhesion promoter, a surfactant, a deforming agent, a fluxing agent, and a toughening agent; and
wherein the packaging composition is a single-phase material.

6. The packaging system according to claim 1, wherein the packaging composition further includes:
at least one additive material selected from an elastomer, a hardener/crosslinker, a catalyst, a reactive diluent, an adhesion promoter, a surfactant, a deforming agent, a fluxing agent, a toughening agent, and an inorganic particulate.

7. The packaging system of claim 1, wherein the packaging composition includes at least one property selected from about 12.5 KSI tensile strength, a coefficient of thermal expansion less than about 60 ppm/° C., and a glass transition temperature greater than about 150° C.

8. A packaging system comprising:
a die; and
a bulky polymer packaging composition coupled to at least a portion of the die, wherein the bulky polymer includes an adamantoid that is part of a linear polymer, selected from a linear polymer, an amino epoxy polymer, an acrylate polymer, an olefin resin polymer, a low-viscosity vinyl polymer, an elastomer polymer, an acrylic polymer, and combinations thereof.

9. A packaging system comprising:
a die; and
a bulky polymer packaging composition coupled to at least a portion of the die, wherein the bulky polymer includes an adamantoid that is part of a graft copolymer, selected from a graft polymer, a graft copolymer wherein the adamantoid is repeated at the graft site from about 1 to about 10, and combinations thereof.

10. A packaging system comprising:
a die; and
a bulky polymer packaging composition coupled to at least a portion of the die, wherein the bulky polymer includes an adamantoid that is part of a block copolymer, selected from a block copolymer, a block copolymer wherein the adamantoid is repeated at the block site from about 1 to about 20, and combinations thereof.

11. A packaging system comprising:
a die; and
a bulky polymer packaging composition coupled to at least a portion of the die, wherein the bulky polymer includes an adamantoid that is part of a star polymer, selected from an adamantane star polymer, an adamantane pentamer, an adamantane hexamer, an adamantane heptamer, and combinations thereof.

12. A packaging system comprising:
a die; and
a bulky polymer packaging composition coupled to at least a portion of the die, wherein the bulky polymer includes an adamantoid that is part of a three dimensional polymer, selected from a three dimensional adamantane polymer, a three dimensional adamantane octamer, and combinations thereof.

13. A packaging system comprising:
a die; and
a bulky polymer packaging composition coupled to at least a portion of the die, wherein the packaging composition is an adamantoid functionalized between 1 and saturation.

14. A chip package comprising:
a chip including an active surface;
a mounting substrate upon which the chip is disposed;
electrical coupling between the chip and the mounting substrate; and
an adamantoid packaging composition in contact with the mounting substrate and coupled to the chip.

15. The chip package of claim 14, wherein the adamantoid is selected from adamantane, linear adamantane polymer, a functionalized adamantoid functionalized between 1 and saturation, functionalized adamantane functionalized between 1 and 10, a linear polymer functionalized with an adamantoid, a linear polymer functionalized with adamantane, a graft adamantoid copolymer, a graft adamantane copolymer wherein that adamantane is in a presence from about 1 to about 20, a block adamantoid copolymer, a block adamantane copolymer wherein that adamantane is in a presence from about 1 to about 20 a star adamantoid polymer, a 3-D adamantane polymer, and combinations thereof.

16. The chip package of claim 14, further including:
an inorganic filler in the packaging composition that forms an inorganic-filled adamantoid composition.

17. The chip package of claim 14, wherein the packaging composition is a single-phase mixture.

18. The chip package of claim 14, wherein the packaging composition includes:
at least one additive selected from an elastomer, a hardener/crosslinker, a catalyst, a reactive diluent, an adhesion promoter, a surfactant, a deforming agent, a fluxing agent, and a toughening agent.

19. The chip package of claim 14, wherein the chip package includes a packaging composition selected from an underfill material, a mold cap material, a bumpless buildup layer material, a die-core fill material, and combinations thereof.

20. A method comprising:
coupling a die and a mounting substrate with an adamantoid packaging composition.

21. The method of claim 20, wherein coupling includes contacting the mounting substrate with an adamantoid selected from adamantane, linear adamantane polymer, a functionalized adamantoid functionalized between 1 and saturation, functionalized adamantane functionalized between 1 and 10, a linear polymer functionalized with an adamantoid, a linear polymer functionalized with adamantane, a graft adamantoid copolymer, a graft adamantane copolymer wherein that adamantane is in a presence from about 1 to about 20, a block adamantoid copolymer, a block adamantane copolymer wherein that adamantane is in a presence from about 1 to about 20 a star adamantoid polymer, a 3-D adamantane polymer, and combinations thereof; and
curing the adamantoid by a process selected from autocatalytic curing, additive catalytic curing, cross-linking, thermoset, and combinations thereof.

22. The method of claim 20, wherein coupling includes forming an encapsulation material from the adamantoid packaging composition.

23. The method of claim 20, wherein coupling includes forming an underfill material from the adamantoid packaging composition.

24. The method of claim 20, wherein coupling includes forming a mold cap material from the adamantoid packaging composition.

25. The method of claim 20, wherein coupling includes forming a bumpless build up layer material from the adamantoid packaging composition.

26. The method of claim 20, wherein coupling includes forming a die-core fill material from the adamantoid packaging composition.

27. A computing system comprising:
a die;
a mounting substrate disposed below the die;
an adamantoid packaging composition coupled to the die and the mounting substrate; and
at least one of an input device and an output device.

28. The computing system according to claim 27, wherein the computing system is disposed in one of a computer, a wireless communicator, a hand-held device, an automobile, a locomotive, an aircraft, a watercraft, and a spacecraft.

29. The computing system according to claim 27, wherein the die is selected from a data storage device, a digital signal processor, a micro controller, an application specific integrated circuit, and a microprocessor.

* * * * *

UNITED STATES PATENT AND TRADEMARK OFFICE
CERTIFICATE OF CORRECTION

| | |
|---|---|
| PATENT NO. | : 7,088,010 B2 |
| APPLICATION NO. | : 10/740283 |
| DATED | : August 8, 2006 |
| INVENTOR(S) | : Lim et al. |

It is certified that error appears in the above-identified patent and that said Letters Patent is hereby corrected as shown below:

In column 12, line 22, in Claim 3, delete "$OCH_3$," and insert -- -$OCH_3$, --, therefor.

Signed and Sealed this

Twenty-second Day of July, 2008

JON W. DUDAS
*Director of the United States Patent and Trademark Office*